United States Patent
Tramoni et al.

(10) Patent No.: US 11,626,862 B2
(45) Date of Patent: *Apr. 11, 2023

(54) CYCLIC CONTROL OF CELLS OF AN INTEGRATED CIRCUIT

(71) Applicant: STMicroelectronics (Rousset) SAS, Rousset (FR)

(72) Inventors: Alexandre Tramoni, Le Beausset (FR); Jimmy Fort, Puyloubier (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 298 days.

This patent is subject to a terminal disclaimer.

(21) Appl. No.: 17/251,738

(22) PCT Filed: Jun. 25, 2019

(86) PCT No.: PCT/HR2019/051553
§ 371 (c)(1),
(2) Date: Feb. 3, 2021

(87) PCT Pub. No.: WO2020/002821
PCT Pub. Date: Jan. 2, 2020

(65) Prior Publication Data
US 2021/0157392 A1  May 27, 2021

(30) Foreign Application Priority Data

Jun. 26, 2018 (FR) ..................... 1855722

(51) Int. Cl.
*G06F 1/3287* (2019.01)
*H03K 3/0233* (2006.01)
*H03K 17/687* (2006.01)

(52) U.S. Cl.
CPC ....... *H03K 3/02337* (2013.01); *G06F 1/3287* (2013.01); *H03K 17/687* (2013.01)

(58) Field of Classification Search
None
See application file for complete search history.

(56) References Cited

U.S. PATENT DOCUMENTS

| | | | | |
|---|---|---|---|---|
| 6,163,190 A | * | 12/2000 | Takai | H03K 3/02337 327/131 |
| 6,922,044 B2 | * | 7/2005 | Walters | H02J 1/102 323/288 |
| 7,834,608 B2 | * | 11/2010 | Cheng | H02M 3/1588 323/299 |
| 9,716,435 B2 | * | 7/2017 | Radhakrishnan | H02M 3/1588 |
| 9,929,651 B2 | * | 3/2018 | Cannankurichi | H02M 3/1563 |
| 9,935,618 B1 | | 4/2018 | Fenigstein | |
| 2014/0070780 A1 | * | 3/2014 | Yanagida | H02M 3/1588 323/271 |
| 2015/0002113 A1 | * | 1/2015 | Miyazaki | H02M 3/156 323/284 |
| 2016/0036327 A1 | | 2/2016 | Nam et al. | |

FOREIGN PATENT DOCUMENTS

| | | |
|---|---|---|
| CN | 102097934 A | 6/2011 |
| JP | H05157626 | 6/1993 |
| JP | 2003188693 A | 7/2003 |

* cited by examiner

*Primary Examiner* — Kenneth B Wells
(74) *Attorney, Agent, or Firm* — Slater Matsil, LLP

(57) ABSTRACT

An embodiment of the present disclosure relates to a circuit of cyclic activation of an electronic function comprising a hysteresis comparator controlling the charge of a capacitive element powering the function.

20 Claims, 1 Drawing Sheet

US 11,626,862 B2

CYCLIC CONTROL OF CELLS OF AN INTEGRATED CIRCUIT

CROSS-REFERENCE TO RELATED APPLICATIONS

This patent application is a national phase filing under section 371 of PCT/FR2019/051553, filed Jun. 25, 2019, which claims the priority benefit of French Application 18/55722 filed on Jun. 26, 2018, all of which applications are hereby incorporated herein by reference in their entireties.

TECHNICAL FIELD

The present disclosure generally relates to electronic circuits and, more specifically, to circuits containing hardware functions capable of being selectively activated.

The present disclosure particularly applies to functions (blocks, cells, circuits, circuit portions, etc.) capable of being cyclically activated.

BACKGROUND

For power consumption reasons, certain electronic circuits comprise hardware functions capable of being selectively activated, so that their power supply can be cut off when they are not used. Some of these functions are cyclically (periodically) activated to simplify the control and to decrease their power consumption, or because this is imposed by the application.

These may be test functions, periodic calculation functions, etc.

SUMMARY

An embodiment overcomes all or part of the disadvantages of known circuits of periodic activation of electronic functions.

An embodiment provides a circuit of cyclic activation of an electronic function comprising a hysteresis comparator controlling the charge of a capacitive element powering said function.

According to an embodiment, said function is activated according to the result of the comparison provided by the comparator.

According to an embodiment, the circuit comprises a source of a constant current for charging the capacitor.

According to an embodiment, a switch is interposed between the current source and the capacitive element.

According to an embodiment, the comparator is powered with a voltage different from the voltage of the capacitive element.

An embodiment provides a method of cyclic activation of an electronic function comprising the steps of:
generating a voltage ramp; and
activating, respectively deactivating, the function on each change of direction of the ramp.

According to an embodiment, the ramp is generated by the charge and the discharge of a capacitive element.

An embodiment provides a circuit comprising:
at least one electronic function; and
at least one activation circuit.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Figure 1:
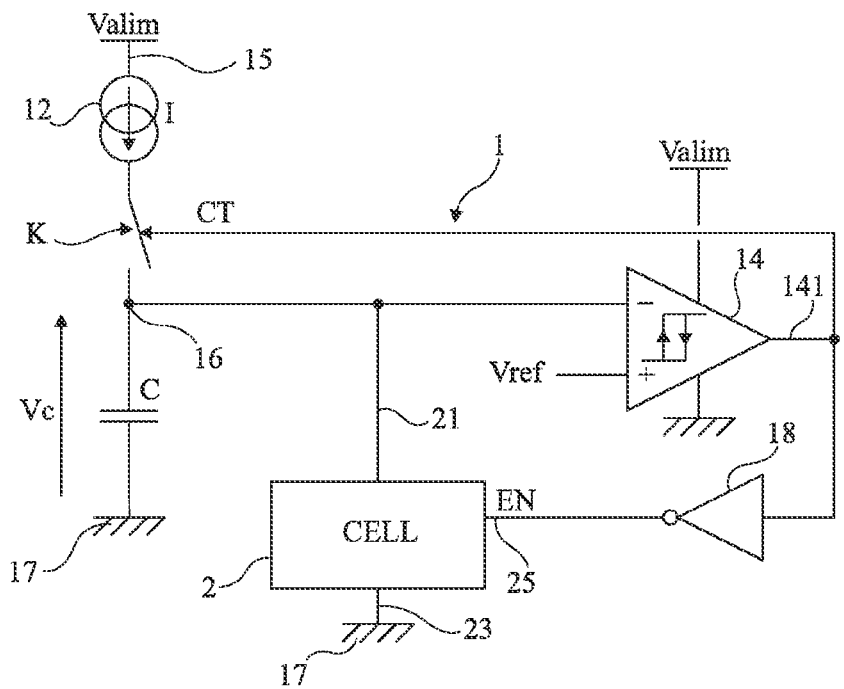
FIG. 1 very schematically shows in the form of blocks an embodiment of cyclic activation circuit.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the function capable of being activated, implemented by a hardware element, block, cell, or circuit, has not been detailed, the described embodiments being compatible with any usual function capable of being cyclically activated.

Unless specified otherwise, when referring to two elements connected to each other, this means directly connected with no intermediate elements other than conductors, and when referring to two elements linked or coupled to each other, this means that these two elements can be connected or be linked or coupled via one or more other elements.

Unless specified otherwise, the terms "about", "approximately", "substantially" and "in the range of" mean with a tolerance of 10%, preferably of 5%.

Generally, a circuit to be cyclically activated receives an activation signal originating from a state machine associated with a clock. The function of the state machine (for example, a counter) is to count a determined number of clock cycles to periodically activate the controlled circuit with a given duty cycle. However, the circuit generating the clock frequency and the state machine should be permanently powered to play their role. The power consumption then generated may be non-negligible. Further, the cyclically activated function is generally permanently powered with the same power supply voltage as that of the state machine which activates it.

According to the described embodiments, it is provided to power the function capable of being selectively activated from a periodic power supply signal. Further, it is provided to generate the periodic activation signal from the periodic power supply signal. Thus, it is preferably provided to modify not only the way in which the function activation signal is generated, but also the way in which the function is powered.

In applications targeted by the present disclosure, a function capable of being cyclically activated of an electronic circuit is a portion of this circuit, called block, cell, or function, capable of being selectively powered with respect to other portions of the electronic circuit.

FIG. 1 very schematically shows in the form of blocks an embodiment of a circuit 1 of cyclic activation of a hardware electronic function 2.

Hardware function 2 is symbolized by a block or cell 2 (CELL) and may be any function compatible with a cyclic activation. Cell 2 comprises two power supply terminals 21 and 23 and one activation terminal 25. Cell 2 comprises other terminals, particularly input/output terminals, not shown, which depend on the application.

Activation circuit 1 is based on the generation of a voltage ramp, made periodic by the alternation of cycles of charge and discharge of a capacitive element C, for example, a capacitor. Capacitor C is coupled, by a switch K controllable in all or nothing, to a source 12 of a current I, preferably constant. Thus, source 12, switch K, and capacitor C are series-connected between terminals 15 and 17 of application of a power supply voltage Valim, terminal 17 defining a reference potential, typically the ground. Voltage Valim is a power supply voltage extracted from the power supply of the electronic circuit integrating function 2 and its activation circuit 1, or the power supply voltage of this circuit.

Switch K is controlled by a signal CT supplied by a hysteresis comparator 14 of voltage Vc across capacitor C with a reference voltage Vref. Thus, node 16 between switch K and capacitor C is coupled, preferably connected, to an input of comparator 14, the other input of comparator 14 receiving voltage Vref. The hysteresis of comparator 14 is defined by two thresholds THH and THL, respectively greater and smaller than voltage Vref and conditioning the switching of output 141 of comparator 14. In the shown example, it is assumed that voltage Vref is applied to the positive input (+) of comparator 14 while voltage Vc is applied to its negative input (−). In this case, the output of comparator 14 switches to a low state as long as increasing voltage Vc reaches threshold THH and switches to a high state as soon as decreasing voltage Vc reaches threshold THL.

Output 141 is coupled, preferably connected, to a control terminal of switch K (for example, the gate of a MOS transistor forming switch K). Terminal 141 is further coupled, in the shown example, to terminal 25 of activation of cell 2 via an inverter 18. Inverter 18 supplies a signal EN for activating the cell, arbitrarily assumed to be active in the high state. The inverse is possible according to the structure of cell 2. For example, for an activation in the low state of cell 2, inverter 18 is omitted.

Comparator 14 (and inverter 18 if present) is powered with voltage Valim.

To combine a power supply and an activation of cell 2, cell 2 is powered by voltage Vc across capacitor C. Thus, its terminal 21 is coupled, preferably connected, to node 16 and its terminal 23 is coupled, preferably connected, to terminal 17.

Figure 2:
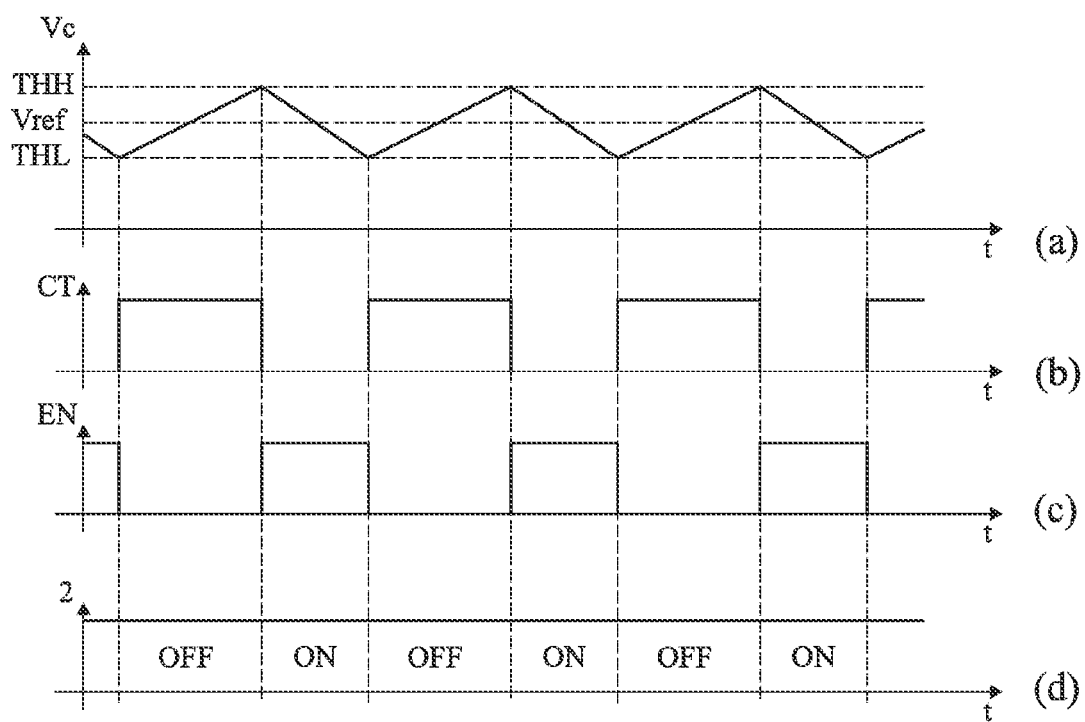
FIG. 2 illustrates, in the form of timing diagrams, the operation of the circuit of FIG. 1.

FIG. 2 illustrates, in timing diagrams (a), (b), (c), and (d), the operation of the circuit of FIG. 1.

Timing diagrams (a), (b), (c), and (d) respectively illustrate examples of the shapes of voltage Vc present on node 16, of signal CT for controlling the turning-on of switch K, of signal EN of activation of cell 2, and of the active (ON) and inactive (OFF) states of cell 2.

Due to hysteresis comparator 14 and to the power supply of cell 2 by capacitor C, the operation is cyclic. In other words, voltage Vc alternates increasing ramps when switch K is on (current source 12 then charging capacitor C) and decreasing ramps when switch K is off (capacitor C discharging in order to power function 2).

The inversion of the output signal of comparator 14 to activate function 2 enables to avoid for the function to permanently consume power. Although there may remain leakage currents, these are lower than those which would exist if function 2 was permanently powered (with voltage Valim).

The duration of the on or off periods of function 2 depends on the hysteresis of the comparator and on the capacitance of capacitor C.

The duration of the off periods of function 2 depends on the intensity of current I and on the capacitance of capacitor C.

As a specific embodiment, one may form a current source 12 of VBG/R type in a MOS technology, that is, which is a function of the bandgap voltage, or of Vbe/R type in a bipolar technology. Voltage Vref is for example, in MOS technology, the bandgap voltage. More generally, it is desired to have a temperature-stable voltage and any voltage of this type is appropriate.

An advantage of the described embodiments is that the power consumption is considerably decreased outside of activation periods. Current source 12, comparator 14, and inverter 18 are the only elements needing to be permanently powered with voltage Valim. For the rest, capacitor C stores power which is delivered back and which is thus not lost.

Another advantage is that the provided solution is less bulky within the circuit. Comparator 12 and optional inverter 18 are the only two elements which need to be internal to circuit 1 and are much less bulky than a state machine. According to the application, capacitor C is or not integrated to the circuit. It may thus be located outside of the electronic circuit integrating cell 2 and activation circuit 1, which enables to further decrease the size of the integrated circuit supporting the function capable of being cyclically activated.

Various embodiments and variations have been described. It will be understood by those skilled in the art that certain characteristics of these various embodiments and variations may be combined, and other variations will occur to those skilled in the art. In particular, the selection of the values to be given to the different components and voltages depends on the application.

Finally, the practical implementation of the described embodiments and variations is within the abilities of those skilled in the art based on the functional indications given hereinabove, particularly regarding the forming of current source 12 and of the different elements according to the components available in the application.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

The invention claimed is:

1. A circuit for cyclic activation of an electronic function, the circuit comprising:
    a capacitive element configured to power the electronic function; and
    a hysteresis comparator configured to:
        control charging of the capacitive element; and
        activate the electronic function according to a result of a comparison performed by the hysteresis comparator.

2. The circuit of claim 1, further comprising a constant current source configured to charge the capacitive element.

3. The circuit of claim 2, further comprising a switch interposed between the constant current source and the capacitive element.

4. The circuit of claim 1, wherein the hysteresis comparator is powered with a flit voltage different from a second voltage of the capacitive element.

5. The circuit of claim 1, wherein the hysteresis comparator has a power input coupled to a supply voltage node.

6. The circuit of claim 2, wherein the constant current source is coupled in series with the capacitive element between a supply voltage node and a reference voltage node.

7. The circuit of claim 3, wherein the hysteresis comparator comprises a first input coupled to a node between the capacitive element and the switch, and a second input coupled to receive a threshold reference voltage.

8. The circuit of claim 7, wherein the hysteresis comparator further comprises a power input coupled to a supply voltage node, and an output coupled to a control input of the switch.

9. A method of cyclic activation of an electronic function, the method comprising:
generating a voltage ramp; and
repeatedly activating and deactivating the electronic function on each change of direction of the voltage ramp.

10. The method of claim 9, wherein generating the voltage ramp comprises charging and discharging a capacitive element.

11. The method of claim 10, wherein repeatedly activating and deactivating the electronic function comprises repeatedly activating and deactivating, respectively, a switch interposed between the capacitive element and a constant current source.

12. The method of claim 10, wherein the voltage ramp is generated by a hysteresis comparator that is configured to control the charging and discharging of the capacitive element.

13. A The method of claim 12, wherein the hysteresis comparator is coupled to repeatedly activate and deactivate the electronic function.

14. The method of claim 13, further comprising powering the hysteresis comparator with a first voltage different from a second voltage of the capacitive element.

15. A circuit comprising:
a supply voltage node;
a reference voltage node;
a capacitive element coupled between the supply voltage node and the reference voltage node;
a constant current source coupled in series with the capacitive element between the supply voltage node and the reference voltage node;
a switch interposed between the constant current source and the capacitive element;
a hysteresis comparator having a first input coupled to a node between the capacitive element and the switch, a second input coupled to receive a threshold reference voltage, and an output coupled to a control input of the switch; and
a cell having a power supply input coupled to the node between the capacitive element and the switch, wherein the cell is configured to perform an electronic function, and configured to be activated according to a result of a comparison performed by the hysteresis comparator.

16. The circuit of claim 15, wherein the cell comprises circuitry configured to perform a sensor function.

17. The circuit of claim 15, wherein the cell comprises an NFC field detector.

18. The circuit of claim 15, wherein the cell further comprises an enable input coupled to the output of the hysteresis comparator.

19. The circuit of claim 15, wherein the hysteresis comparator is configured to be powered with a first voltage different from a second voltage of the capacitive element.

20. The circuit of claim 19, wherein the hysteresis comparator has a power input coupled to the supply voltage node.

* * * * *

UNITED STATES PATENT AND TRADEMARK OFFICE
CERTIFICATE OF CORRECTION

PATENT NO. : 11,626,862 B2
APPLICATION NO. : 17/251738
DATED : April 11, 2023
INVENTOR(S) : Alexandre Tramoni Page 1 of 1

It is certified that error appears in the above-identified patent and that said Letters Patent is hereby corrected as shown below:

On the Title Page

Item (86), PCT No.; delete "PCT/HR2019/051553" and insert --PCT/FR2019/051553--.

In the Claims

Claim 4, Column 5, Line 2; delete "flit" and insert --first--.

Claim 13, Column 5, Line 35; delete "A" before --The--.

Signed and Sealed this
Sixteenth Day of May, 2023

Katherine Kelly Vidal
*Director of the United States Patent and Trademark Office*